United States Patent [19]
Schlichtig

[11] Patent Number: 4,644,410
[45] Date of Patent: Feb. 17, 1987

[54] DYNAMIC THRESHOLD BINARY GENERATOR

[75] Inventor: Roger J. Schlichtig, Westlake Village, Calif.

[73] Assignee: R. A. McDonald, Encino, Calif.

[21] Appl. No.: 710,075

[22] Filed: Mar. 11, 1985

[51] Int. Cl.⁴ .............................................. H04N 1/40
[52] U.S. Cl. .................................. 358/282; 358/283; 382/52; 382/53; 307/358
[58] Field of Search ................. 358/282, 280, 283, 96, 358/284; 382/52, 53, 50, 51, 54, 55; 307/359, 522, 525, 520, 358

[56] References Cited

U.S. PATENT DOCUMENTS

| | | | |
|---|---|---|---|
| 3,159,815 | 12/1964 | Groce | 382/53 |
| 3,225,213 | 12/1965 | Hinrichs et al. | 382/53 |
| 3,599,151 | 8/1971 | Harr | 382/53 |
| 3,621,129 | 11/1971 | Fisher | 358/93 |
| 3,763,357 | 10/1973 | Morton | 382/53 |
| 3,833,883 | 9/1974 | Haupt et al. | 382/53 |
| 3,869,698 | 3/1975 | Trost et al. | 382/53 |
| 4,228,465 | 10/1980 | Stone et al. | 358/167 |
| 4,272,789 | 6/1981 | Biron | 358/282 |
| 4,446,486 | 5/1984 | Itoh | 358/280 |
| 4,454,539 | 6/1984 | Fedde et al. | 358/282 |
| 4,468,704 | 8/1984 | Stoffel et al. | 382/52 X |

Primary Examiner—James J. Groody
Assistant Examiner—Theodore W. Olds
Attorney, Agent, or Firm—Browdy and Neimark

[57] ABSTRACT

A dynamic threshold binary generator to generate a binary video image having a standard video signal fed to three positive peak detectors and three negative peak detectors, each group of three connected through respective OR gates to a sample and hold circuit then fed to an averaging circuit which then feeds to a comparator which also receives the standard video signal delayed, to then feed out the binary video image signal.

4 Claims, 8 Drawing Figures

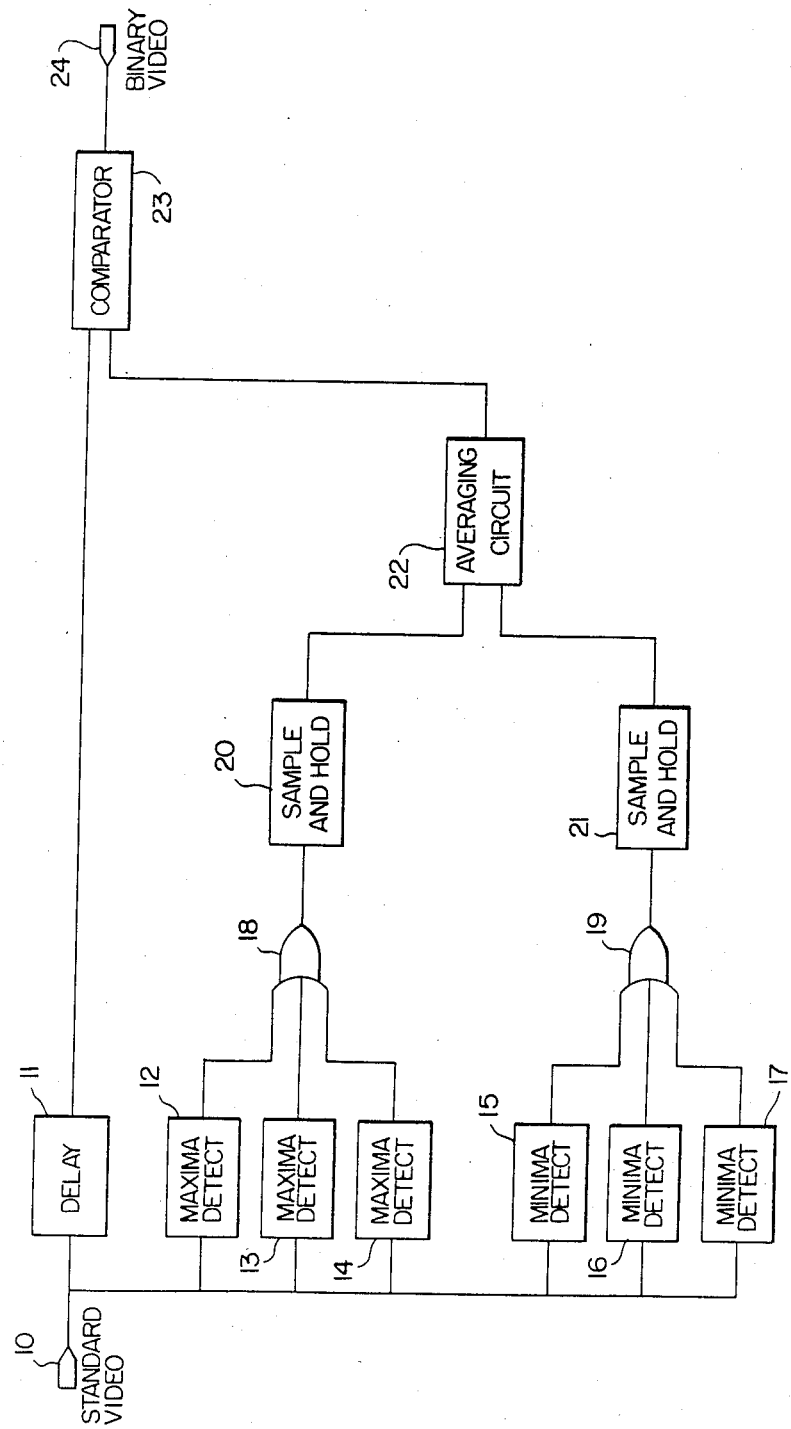

DYNAMIC THRESHOLD BINARY GENERATOR

BACKGROUND OF THE INVENTION

It is the purpose of the present invention to generate a binary video image consisting of only black and white levels with no gray tones which will contain as much of the detail of the original video signal as is possible with a binary image.

In the binary video image generated, the surface shape characteristics such as curvature may not be apparent, but most other types of detail such as lettering, square edges, texture, etc., would not be lost, even in the presence of variable light conditions, whether it be bright light or shade.

In prior art devices with the use of a single peak detector results were obtained in the dynamic range of only 10 to 1. This occurs because the first part of the prior art peak detector is a differentiator. The amplitude of the output of a differentiator is directly proportional to both the frequency and the amplitude of the input.

SUMMARY OF THE INVENTION

It is an object of the present invention to generate a binary video image of much improved detail over images generated by prior art devices.

It is another object of the present invention to have a device which can be used for applications besides the prior art use for optical character recognition.

It is a further object of the present invention to have a greatly increased dynamic range.

In accordance with the present invention the device utilizes a series of peak detector circuits, each tuned for a specific frequency range, and can span the entire video spectrum.

BRIEF DESCRIPTION OF THE DRAWINGS

The above and other objects and advantages of the invention will become apparent upon full consideration of the following detailed description and accompanying drawings in which:

FIG. 1 is a block diagram of the circuitry of the present invention; and

DESCRIPTION OF THE PREFERRED EMBODIMENT

Figure 2A:
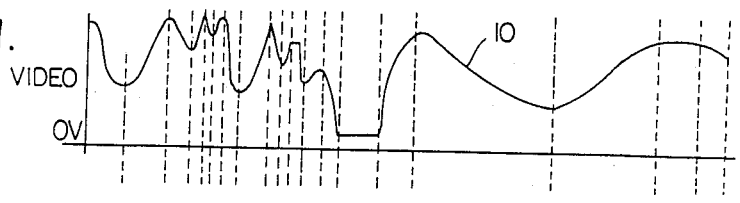
FIGS. 2A through 2G show the waveforms found at different points of the circuitry of FIG. 1.

Referring first to FIG. 1 where there is shown a block diagram of the circuitry of dynamic threshold binary image generator of the present invention, a standard gray scale video signal 10 is fed simultaneously to both a delay line 11 and a series of peak detectors 12–17. Each of peak detectors 12–17 is tuned to cover a portion of the spectrum of frequencies present on a horizontal video scan line. Maxima peak detectors 12–14 are provided to detect positive peaks and minima peak detectors 15–17 are provided to detect negative peaks. The covered spectrum of the frequencies on the horizontal video scan line is from 15 khz. to 4.5 mhz. which represents a dynamic range of 300 to 1. By utilization of this series of peak detector circuits, each tuned for a specific frequency range, the entire video spectrum is thereby scanned.

Maxima detectors 12–14 have their outputs connected to OR gate 18 and minima detectors 15–17 have their outputs connected to OR gate 19. The current video passes through each of OR gates 18 or 19 and is strobed into its respective high speed sample and hold circuit 20 or 21. The outputs of these sample and hold circuits 20 and 21 go to averaging circuit 22. The output of averaging circuit 22 which is the average of the two outputs of circuits 20 and 21 is the "dynamic threshold". This average signal from averaging circuit 22 is compared, in comparator 23, to the output of delay 11, which is the delayed original video signal. This delay is inserted into the circuit to compensate for propogation delay times through the peak detectors, sample and hold and averaging circuits. The output of comparator 23 is the desired binary video image 24.

Figure 2B:
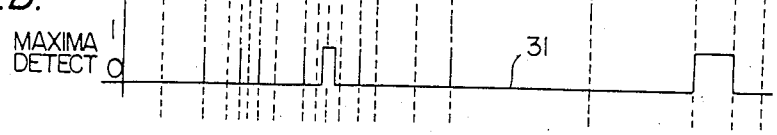
Figure 2C:
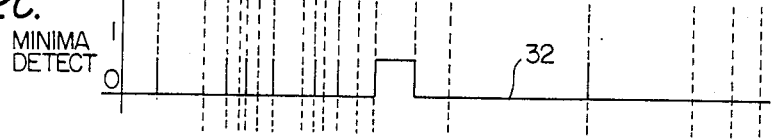

The waveforms obtained throughout the circuitry of FIG. 1 are illustrated in FIGS. 2A through 2G and are identified thereon. As shown in FIG. 2A, waveform 10 is the original standard gray scale video signal fed to delay 11 and detectors 12–17. Pulse forms on line 31 in FIG. 2B are the pulsed output of maxima detectors 1214 14 which pass through OR gate 18 to high speed sample and hold circuit 20. The pulse forms on line 32 of FIG. 2C are the pulsed output of minima detectors 15–17 which pass through OR gate 19 to high speed sample and hold circuit 21.

Figure 2D:
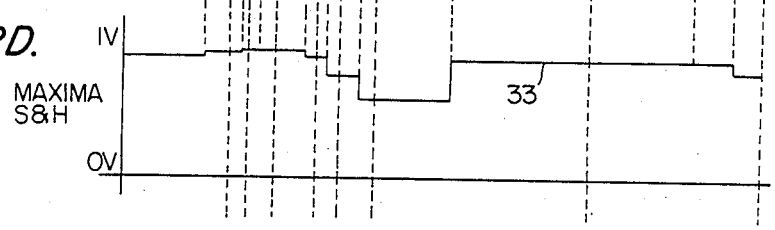
Figure 2E:
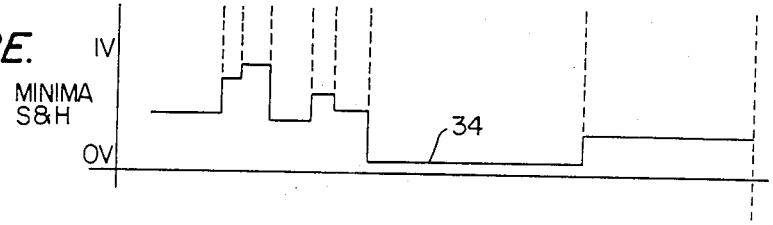

Waveform 33 of FIG. 2D is the output signal from sample and hold circuit 20 and waveform 34 of FIG. 2E is the output signal from sample and hold circuit 21, both of which are fed to averaging circuit 22.

Figure 2F:
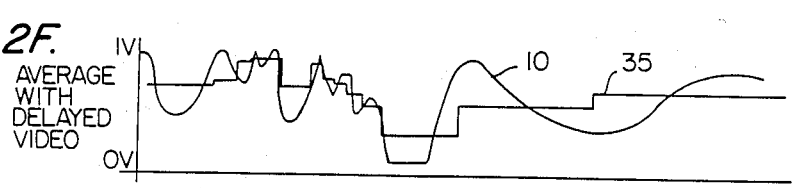
Figure 2G:

In FIG. 2F waveform 35, which is the average signal of waveforms 33 and 34 and the so-called dynamic threshold, is the output of averaging circuit 22 and is shown overlaid on original video signal 10, showing both inputs to comparator 23. The output of comparator 23 shown in FIG. 2G is the binary video image signal 24.

Signal 24 will consist of only the black and white levels of the video signal 10 without the intermediate gray tones and through the circuitry of this invention will show these levels with greatly improved detail over that of the prior art.

It will be obvious to those skilled in the art that various changes may be made without departing from the scope of the invention and the invention is not to be considered limited to what is shown in the drawings and described in the specification.

What is claimed is:

1. A dynamic threshold binary image generator comprising
    input means to feed in a standard video signal;
    positive peak detectors and negative peak detectors connected to said input means to receive said standard video signal;
    delay means also connected to said input means to receive said standard video signal simultaneously with the receipt of said standard video signal by said detectors;
    a first OR gate connected to receive output signals from said positive peak detectors;
    a second OR gate connected to receive output signals from said negative peak detectors;
    a first sample and hold circuit connected to receive signals passed through said first OR gate;
    a second sample and hold circuit connected to receive signals passed through said second OR gate;
    an averaging circuit connected to receive signals from both said first and second sample and hold circuits;

comparator means connected to receive signals from said delay means and from said averaging circuit and to produce a binary image video signal.

2. The dynamic threshold binary image generator of claim 1 further characterized by said positive peak detectors including
a first plurality of detectors each tuned for a specific frequency range;
and said negative peak detectors including
a second plurality of detectors each tuned for a specific frequency range.

3. The dynamic threshold binary image generator of claim 2 further characterized by
said peak detectors covering a frequency range of from substantially 15 khz. to 4.5 mhz.

4. The dynamic threshold binary image generator of claim 2 further characterized by
said first plurality of positive peak detectors including at least three detectors; and
said second plurality of negative peak detectors including at least three detectors.

* * * * *